United States Patent
Takeuchi

Patent Number: 5,977,614
Date of Patent: *Nov. 2, 1999

[54] LEAD ON CHIP TYPE SEMICONDUCTOR INTEGRATED CIRCUIT DEVICE TO AVOID BONDING WIRE SHORT

[75] Inventor: Yasuhito Takeuchi, Kanagawa, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/858,891

[22] Filed: May 19, 1997

Related U.S. Application Data

[63] Continuation of application No. 08/537,226, Sep. 29, 1995, abandoned, which is a continuation of application No. 08/087,530, Jul. 8, 1993, abandoned.

[30] Foreign Application Priority Data

Jul. 8, 1992 [JP] Japan .................................... 4-181317

[51] Int. Cl.[6] ................................................ H01L 23/495
[52] U.S. Cl. .......................... 257/666; 257/690; 257/691; 257/692
[58] Field of Search ..................................... 257/666, 690, 257/691, 692, 784

[56] References Cited

U.S. PATENT DOCUMENTS

| | | | |
|---|---|---|---|
| 5,068,712 | 11/1991 | Murakami et al. | 257/692 |
| 5,229,639 | 7/1993 | Hansen et al. | 257/692 |
| 5,250,840 | 10/1993 | Oh et al. | 257/666 |

*Primary Examiner*—Carl Whitehead, Jr.
*Attorney, Agent, or Firm*—Sughrue, Mion, Zinn, Macpeak & Seas, PLLC

[57] ABSTRACT

The lead structure for a first power supply potential is formed by first and second power supply leads 35a and 35b and a first connecting conductor part 36a connected there, and the lead structure for a second power supply potential is formed by third and fourth power supply leads 35c and 35d and a second connecting conductor part 36b connected there. The first connecting conductor part 36a and the second connecting conductor part 36b are placed at the central part of a semiconductor chip with a predetermined spacing between them, a plurality of first signal leads 34a and first signal pads 32a which are respectively connected there are disposed in the area between the first connecting conductor part 36a and a first edge 41, and a plurality of second signal leads 34b and second signal pads which are respectively connected there are disposed in the area between the second connecting conductor part 36b and a second edge 42.

5 Claims, 4 Drawing Sheets

LEAD ON CHIP TYPE SEMICONDUCTOR INTEGRATED CIRCUIT DEVICE TO AVOID BONDING WIRE SHORT

This is a Continuation of application Ser. No. 08/537,226 filed on Sept. 29, 1995 now abandoned, which is a continuation of application Ser. No. 08/087,530 filed on Jul. 8, 1993 now abandoned.

BACKGROUND OF THE INVENTION

1. Field of the Invention

This invention relates to a semiconductor integrated circuit device, and more particularly to a wiring connection structure in a lead on chip (LOC) type semiconductor integrated circuit device.

2. Description of the Related Art

Since an LOC type semiconductor integrated circuit device in which leads of a lead frame are extended on a semiconductor chip and the tip parts of the leads are connected to bonding pads by means of bonding wires enables one to increase the area of the semiconductor chip and to install the bonding pads not only in the periphery of the semiconductor chip but also in its central part, the device is in widespread use in recent years.

An example of the prior art LOC type semiconductor integrated circuit device is shown in FIG. 1. Bonding pads 13 for supplying power supply potentials (abbreviated as power supply pads hereinafter) and bonding pads 12 for supplying and receiving clock signals, address signals, data input and output signals, or the like (abbreviated as signal pads hereinafter) are disposed in the direction of the long side of the semiconductor chip 11 at its central part. It should be mentioned that in each of the drawings a black square indicates a power supply pad and an unpainted square indicates a signal pad. Leads 15 for supplying power supply potentials (abbreviated as power supply leads hereinafter) and leads 14 for supplying and receiving various kinds of signals (abbreviated as signal leads hereinafter) come onto the semiconductor chip 11 with their tip parts connected to the corresponding power supply pads 13 and signal pads 12, respectively by the bonding wires 17. However, in this type of semiconductor integrated circuit has problem which the power supply leads 15 are required corresponding to a plurality of power supply pads 13 so that the leads of the lead frame end up with a large number.

To solve this problem, if one employs a method in which a power supply wiring layer is formed on the semiconductor chip by photolithography technique and the power supply potentials provided are connected to the same plurality of power supply pads 13 by laying the wiring layer around, the number of the power supply leads 15 can be reduced. However, in this method the resistance and the parasitic capacity of the wiring layer are increased due to the elongation of the power supply wiring layer, thereby bringing about an adverse effect on the properties of the device.

As a technique for eliminating the above-mentioned inconvenience, an LOC type semiconductor integrated circuit device as shown in FIG. 2 is disclosed in U.S. Pat. No. 4,916,519. In the figure, a power supply lead structure for supplying a first power supply potential, for example, for supplying potential Vcc, is constructed by inserting a connecting conductor part 26a between a pair of power supply leads 25a and 25b to form a unified body, and another power supply lead structure for supplying a second power supply potential, for example, for supplying the ground (GND) potential, is constructed by inserting a connecting conductor part 26b between a pair of power supply leads 25c and 25d to form a unified body. The power supply pads 13 for supplying potential Vcc are connected to the connecting conductor part 26a by the bonding wires 17, and the power supply pads 13 for supplying potential GND are connected to the connecting conductor part 26b by the bonding wires 17. The signal pads 12 are connected to the corresponding signal leads 14 by means of the bonding wires 27. However, since the connecting conductor parts 26a and 26b for supplying potentials are disposed between the signal pads 12 and the signal leads 14, the bonding wires 27 grade separate the connecting conductor parts 26a and 26b, that is, cross over the connecting conductor parts 26a and 26b. However, in the above-mentioned structure there is a possibility of generating an accident in which the bonding wires 27 that straddle over the connecting conductor parts may sag down and the bonding wires 27 which form the signal system may be short circuited to the connecting conductor parts which form the power supply system.

SUMMARY OF THE INVENTION

It is therefore the object of this invention to provide an LOC type semiconductor integrated circuit device which minimizes the number of the power supply leads, reduces the resistance of the power supply system, and avoids short circuit accident between the signal leads and the power supply system.

A feature of this invention is to provide, in semiconductor integrated circuit devices comprising a semiconductor chip, a plurality of power supply pads and a plurality of signal pads formed in the semiconductor chip, a plurality of power supply leads and a plurality of signal leads formed by extending them from the outside of the semiconductor chip onto the semiconductor chip, a connecting conductor parts which connect a pair of power supply leads and extends on the semiconductor chip, first bonding wires which connect the power supply pads and the connecting conductor parts, and second bonding wires which connect the signal pads and the bonding region of the signal leads, a semiconductor integrated circuit device in which the respective signal pads and the bonding regions of the signal leads that are connected to these pads are arranged facing each other without interposition of the connecting conductor parts between them, thereby the second bonding wires are not crossing over the connecting conductor part.

Another feature of this invention is to provide a semiconductor integrated circuit device comprising a semiconductor chip having a first and a second edges extending mutually parallel in a first direction and a third and a fourth edges extending mutually parallel in a second direction perpendicular to the first direction, a first and a second power supply leads for supplying a first power supply potential extending from outside the semiconductor chip onto the semiconductor chip, a third and a fourth power supply leads for supplying a second power supply potential extending from outside the semiconductor chip onto the semiconductor chip, a first connecting conductor part formed as a unified body with the first and the second power supply leads having a portion extending on the semiconductor chip in the first direction, a second connecting conductor part formed in a unified body with the third and the fourth power supply leads having a portion extending on the semiconductor chip in the first direction with a predetermined space from the first connecting conductor part, a plurality of first signal leads passing over the first edge and extending on the area of the semiconductor chip between the first connecting conductor part and the first edge, a plurality of second signal leads passing over the second edge and extending on the area of the semiconductor chip between the second connecting conductor part and the second edge, a first power supply pad formed on the semiconductor chip, a second power supply pad formed on the semiconductor chip, a plurality of first signal pads formed in the area of the semiconductor chip between the first connecting conductor part and the first edge, a plurality of second signal pads formed in the area of the semiconductor chip between the second connecting conductor part and the second edge, a plurality of first bonding wires connecting the portion between the first power supply pad and the first connecting conductor part and the portion between the second power supply pads and the second connecting conductor part, respectively, and a plurality of second bonding wires connecting the plurality of the first and the second signal pads and the plurality of the first and the second signal leads, respectively, The plurality of the first signal pads is formed by disposing them in the first direction in the area between the first connecting conductor part and the first edge, and the plurality of the second signal pads is formed by disposing them in the second direction in the area between the second connecting conductor part and the second edge. In this case, the plurality of the first signal pads are formed by disposing them in the part near the first edge of the semiconductor chip in the first direction, and the plurality of the second signal pads are formed by disposing them in the first direction in the part near the second edge of the semiconductor chip, the second bonding wires connected to the first signal leads are connected to the respective first signal pads that are extended in the direction of the first edge and are disposed in the vicinity of the first edge, and the second bonding wires connected to the second signal leads are connected to the respective second signal pads that are extended in the direction of the second edge and are arrayed in the vicinity of the second edge, respectively.

Furthermore, third signal pads are formed disposed in the first direction along with the plurality of the first signal pads in the area of the semiconductor chip outside of the area between the first connecting conductor part and the first edge, being also in the vicinity of the first edge, and fourth signal pads are formed disposed in the first direction along with the plurality of the second signal pads in the area of the semiconductor chip outside of the area between the second connecting conductor part and the second edge, being also in the vicinity of the second edge. The second bonding wires connected to third signal leads extend in the direction of the first edge and are connected to the respective third signal pads disposed in the vicinity of the first edge, and the second bonding wires connected to fourth signal leads extend in the direction of the second edge and are connected to the respective fourth signal pads disposed in the vicinity of the second edge.

Each of the bonding wires is bonded to the tip part of each of the signal leads. However, each of the bonding wires are also bonded to a part away from the tip part of each of the signal leads. In that case, it is preferable that the tip part has a plane form with indentations.

Alternatively, the plurality of the first signal pads may be formed by disposing them in the area of the semiconductor chip between the first connecting conductor part and the first edge in the second direction, and the plurality of the second signal pads may be formed by disposing them in the area of the semiconductor chip between the second connecting conductor part and the second edge in the second direction. In that case, it is preferable to have the first signal leads extended in the second direction, passed over the first edge, bent toward the first direction after laid over the semiconductor chip, and have their up parts faced with the first signal pads, and to have the second signal leads extended in the second direction, passed over the second edge, bent toward the first direction after laid over the semiconductor chip, and have their tip parts faced with the second signal pads.

The signal pads and the signal pads can be used as leads and bonding pads for clock signal, data input and output, write enable, row address strobe, output enable, or column address strobe.

It is preferable to form a plurality of the first and second power supply pads, respectively, in the semiconductor integrated circuit device. In that case, a part of the pads of the plurality of the first power supply pads are formed in the area of the semiconductor chip between the first connecting conductor part and the first edge and the remaining pads are formed in the area of the semiconductor chip between the first and the second connecting conductor parts, and a part of the pads of the plurality of the second power supply pads are formed in the area of the semiconductor chip between the second connecting conductor part and the second edge and the remaining pads are formed in the area of the semiconductor chip between the first and is the second connecting conductor parts. Or else, all of the plurality of the first and the second power supply pads may be formed in the area of the semiconductor chip between the first and the second connecting conductor parts.

Moreover, the first and the second power supply leads may be laid on the semiconductor chip by passing over the first edge, and the third and the fourth power supply pads may be laid on the semiconductor chip by passing over the second edge. Or, the first and the third power supply leads may be made to come onto the semiconductor chip by extending them over the third edge in the second direction, and the second and the fourth power supply leads may be made to come onto the semiconductor chip by extending them over the fourth edge in the second direction. Or else, the first and the third power supply leads may be made to come onto the semiconductor chip by extending them over the third edge, the second power supply lead may be made to traverse the first edge over its entire width and come onto the semiconductor chip, and the fourth power supply lead may be made to traverse the second edge over its entire width and come onto the semiconductor chip.

Furthermore, a fifth power supply lead for supplying the first power supply potential which is not connected to the first connecting conductor part and a sixth power supply lead for supplying the second power supply potential which is not connected to the second connecting conductor part may be formed, the fifth power supply lead may be connected by the first bonding wire to the first power supply pad not connected to the first connecting conductor part, and the sixth power supply lead may be connected by the first bonding wire to the second power supply pad not connected to the second connecting conductor part.

It may be that the first power supply potential is positive (Vcc) or negative (Vss) with respect to the ground potential and the second power supply potential is the ground potential (GND), or that the first power supply potential is positive relative to the ground potential and the second power supply potential is negative relative to the ground potential.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
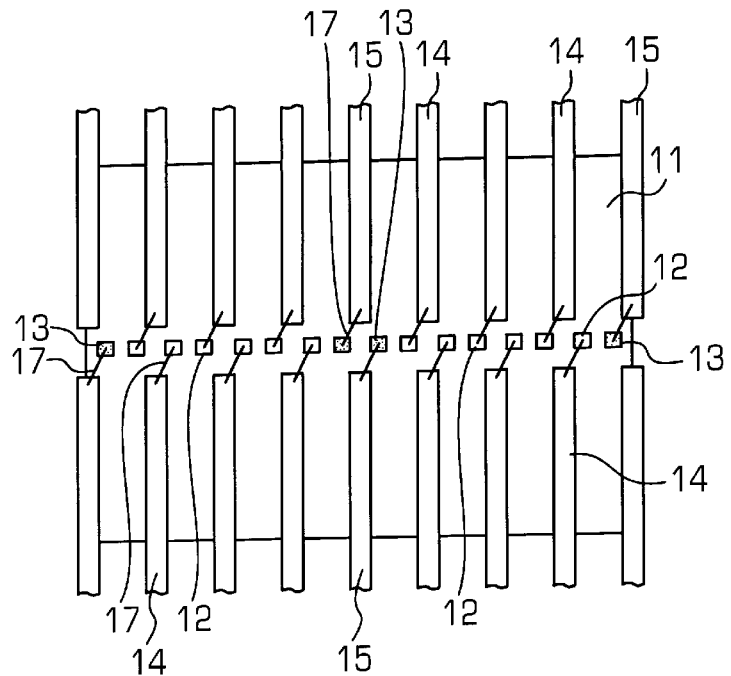
FIG. 1 is a plan view showing the relation between the semiconductor chip and the leads in a conventional semiconductor integrated circuit device.
Figure 2:
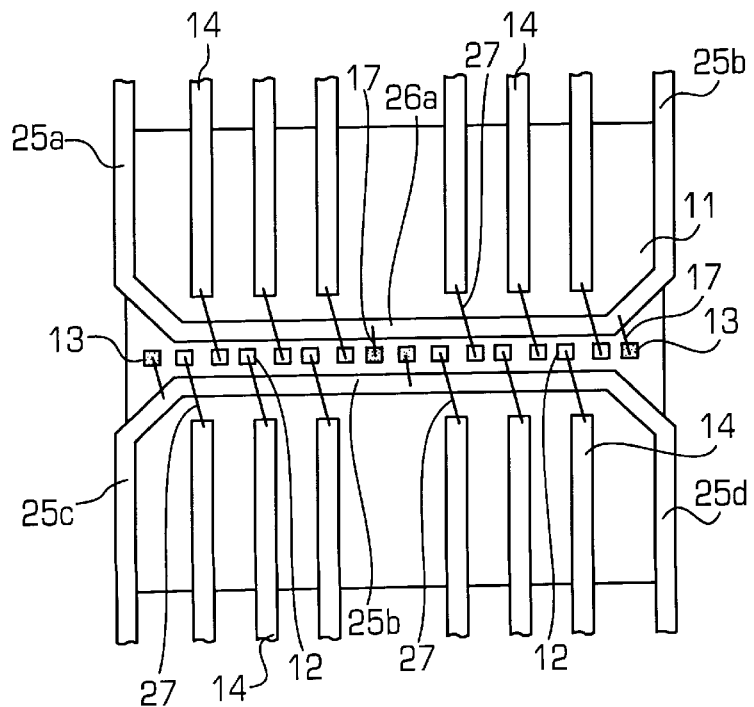
FIG. 2 is a plan view showing the relation between the semiconductor chip and the leads in another conventional semiconductor integrated circuit device.

Next, referring to the drawings, this invention will be described.

Figure 3:
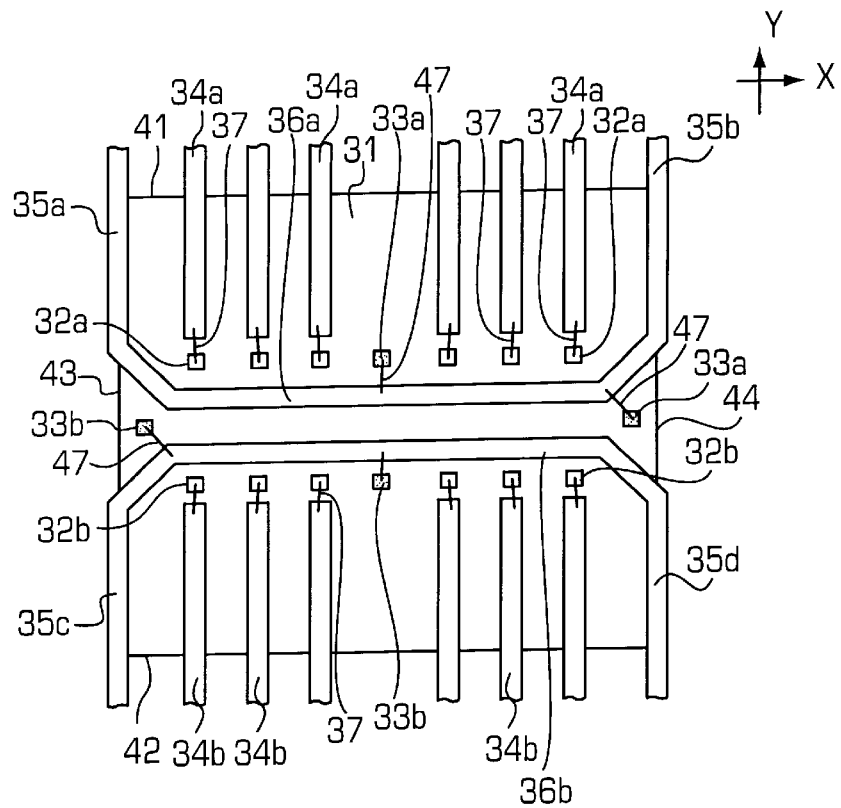
FIG. 3 is a plan view showing the relation between the semiconductor chip and the leads in a first embodiment is of the invention.

In FIG. 3 showing the first embodiment of the invention, a plurality of first power supply pads 33a for supplying Vcc, a plurality of second power supply pads 33b for supplying the ground potential, and a plurality of first and second signal pads 32a and 32b are formed at the central part of a semiconductor chip 31 having 20 mm long first and second edges 41 and 42 which run mutually parallel in the X direction and 10 mm long third and fourth edges 43 and 44 which run mutually parallel in the Y direction. On the other hand, a first and a second power supply leads 35a and 35b for supplying Vcc come onto the semiconductor chip 31 crossing the first edge 41 and extending in the Y direction over the third and the fourth edges 43 and 44, respectively, where they are connected continuously to a 0.5 to 0.3 mm wide first connecting conductor part 36a having a portion extending in the X direction to form a power supply lead structure for Vcc. Similarly, the third and the fourth power supply leads 35c and 35d for supplying the ground potential come onto the semiconductor chip 31 crossing the second edge 42 and extending in the Y direction over the third and the fourth edges 43 and 44, respectively, where they are connected continuously to a 0.5 to 0.8 mm wide second connecting conductor part having a portion extending in the X direction by maintaining a distance of 2.0 to 2.5 mm from the first connecting conductor part 36a to form a power supply lead structure for the ground potential. In addition, a plurality of first and second signal leads 34a and 34b for supplying and receiving various kinds of signals such as clock signals come onto the semiconductor chip for a distance of about 3 mm by crossing the first and the second edges 41 and 42, respectively.

The whole of the plurality of the first signal pads 32a and a part of the first power supply pads 33a are disposed along the x direction in the space between the first edge 41 and the first connecting conductor pad 36a, where the first signal pads 32a are arranged facing respectively the bonding regions of the first signal leads 34a to be connected with them. Similarly, the whole of the plurality of the second signal pads 32b and a part of the second power supply pads 33b are disposed along the X direction in the space between the second edge 42 and the second connecting conductor part 36b, where the second signal pads 32b are arranged facing respectively the bonding regions of the second signal leads 34b to be connected with them. The remaining the first and the second power supply pads 33a and 33b are arranged in the space between the first connecting conductor part 36a and the second connecting conductor part 36b.

With such a configuration, it is possible to connect by bonding the plurality of the first power supply pads 33a to portions near the lead structure for Vcc consisting of the first and the second power supply leads 35a and 35b, and the first connecting conductor part 36a by means of the respective first bonding wires 47, and similarly to connect by bonding the plurality of the second power supply pads 33b to portions near the power supply lead structure for the ground potential consisting of the third and the fourth power supply leads 35c and 35d, and the second connecting conductor part 36b by means of the respective first bonding wires 47. Since the connecting conductor part is a part of the lead frame and has the same material and film thickness as the lead, it is possible to neglect the resistance at the connecting conductor part:.

Moreover, according to the above-mentioned configuration, the plurality of the first signal pads 32a and the first signal leads 34a that are connected thereto are disposed in the area between the first edge 41 and the first connecting conductor part 36, and the plurality of the second signal pads 32b and the second signal leads 34b that are connected thereto are disposed in the area between the second edge 42 and the second connecting conductor part 36b. In other words, these pads and the bonding regions of these leads that are connected thereto are placed within the same region surrounded by a pair of power supply leads and a connecting conductor part. Accordingly, the bonding wires 37 that connect by bonding the first and the second signal leads 34a and 34b to the first and the second signal pads 32a and 32b will not traverse the power supply lead structures including the first and the second connecting conductor parts 36a a and 36b. Because of this, there will be absolutely no short circuiting accident between the first bonding wires 37 and the power supply lead structures. Moreover, a bonding wire will never cross over other signal leads or other bonding wires as shown in the figure so that short circuiting accident that might otherwise occur will not take place.

The bonding wires 37 and 47 are fine gold wires of, for example, diameter 0.03 mm and length 1.2 to 2.5 mm, and their connection to the pads is accomplished by thermocompression bonding method or ultrasonic method. In addition, the various kinds of signal leads, power supply leads, and connecting conductor parts form a lead frame, integrally formed from a copper plate of, for example, 0.2 mm thickness, which is affixed to the top surface of the semiconductor chip by an adhesive tape of, for example, 0.09 mm thick.

Figure 4:
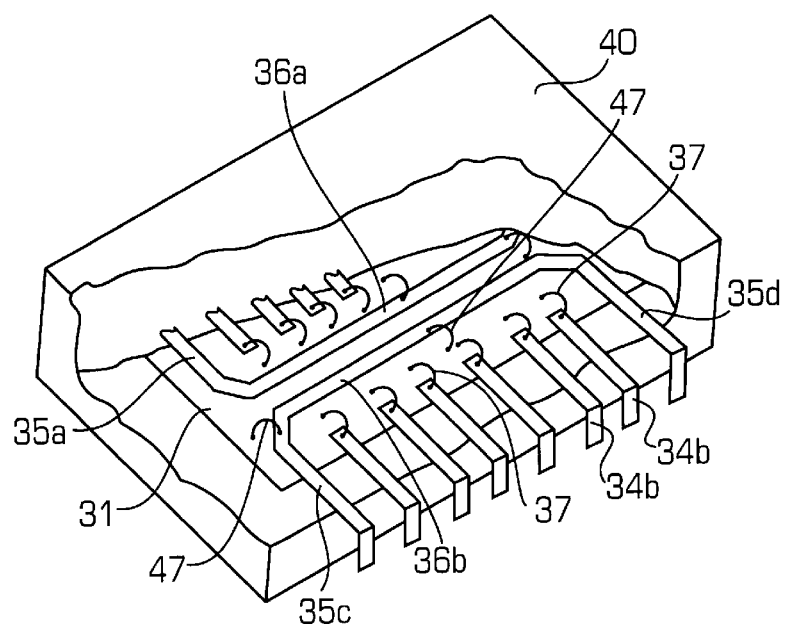
FIG. 4 is a perspective view showing the interior of the first embodiment of the invention by partially breaking the sealing resin.

Following the process shown in FIG. 3, the semiconductor chip and its vicinity are molded with resin as shown in FIG. 4, the leads that are led out of the side faces of sealing resin 40 are cut off from the lead frame, and bent by 90°, completing the semiconductor integrated circuit device.

Figure 5:
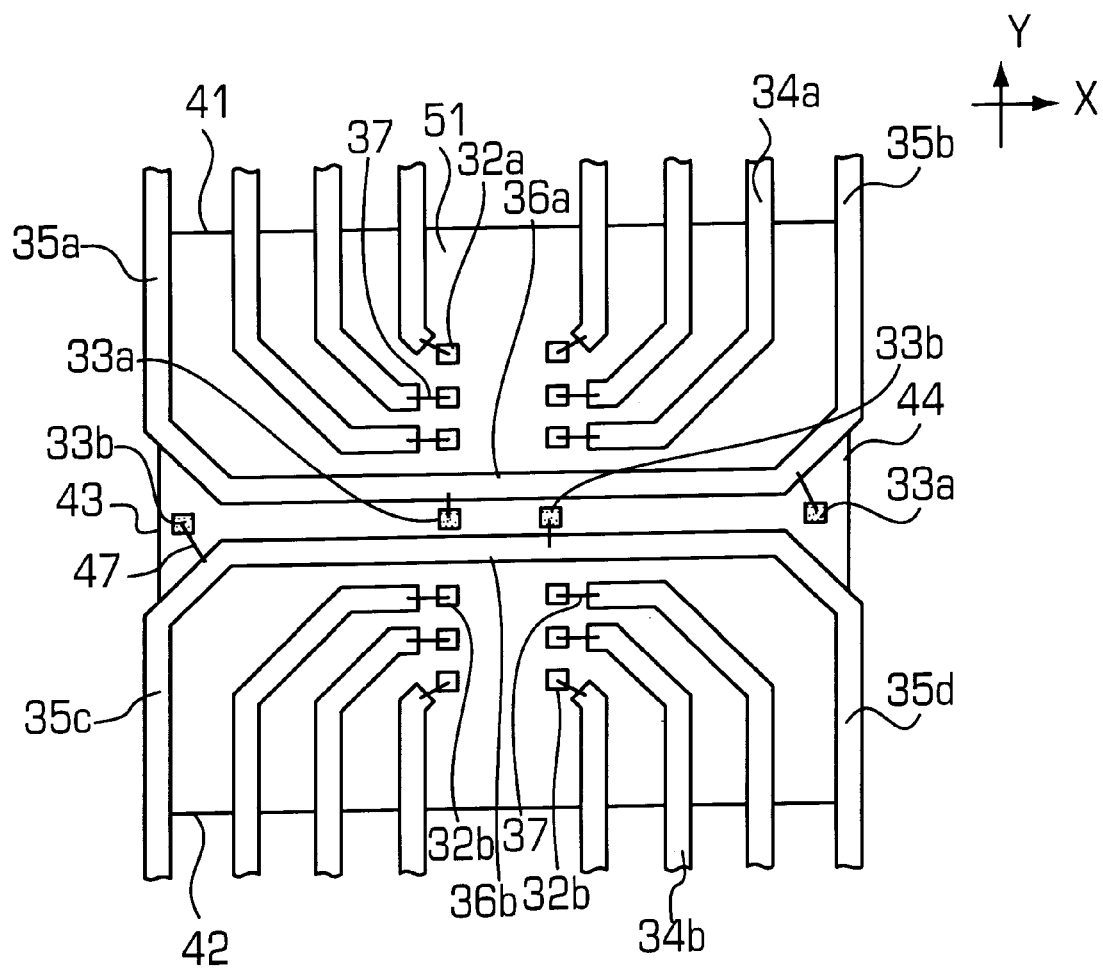
FIG. 5 is a plan view showing the relation between the semiconductor chip and the leads in a second embodiment of the invention.

Next, referring to FIG. 5, the second embodiment of the invention will be described. In FIG. 5, portions with identical or similar functions as in FIG. 3 are given the same reference symbols to avoid repeated explanation.

In this second embodiment, the power supply pads 33a and 33b are all disposed in the area between the first connecting conductor part 36a and the second connecting conductor part 36b. On the other hand, the first and the second signal pads 32a and 32b are disposed in the Y direction perpendicular to the first and the second edges 41 and 42 of semiconductor chip 51, the first signal leads 34a are passed over the first edge 41 by extended in the Y direction, bent toward the X direction after laid on the semiconductor chip 51, and their tip parts are faced against the signal pads 32a. Similarly, the second signal leads 34b are passed over the second edge 42 by extended in the Y direction, bent toward the X direction after laid on the semiconductor chip 51, and their tip parts are faced against the signal pads 32b. Depending upon the shape of the semiconductor chip and the circuit layout there arises a case where the arrangement of this embodiment becomes preferable.

Figure 6:
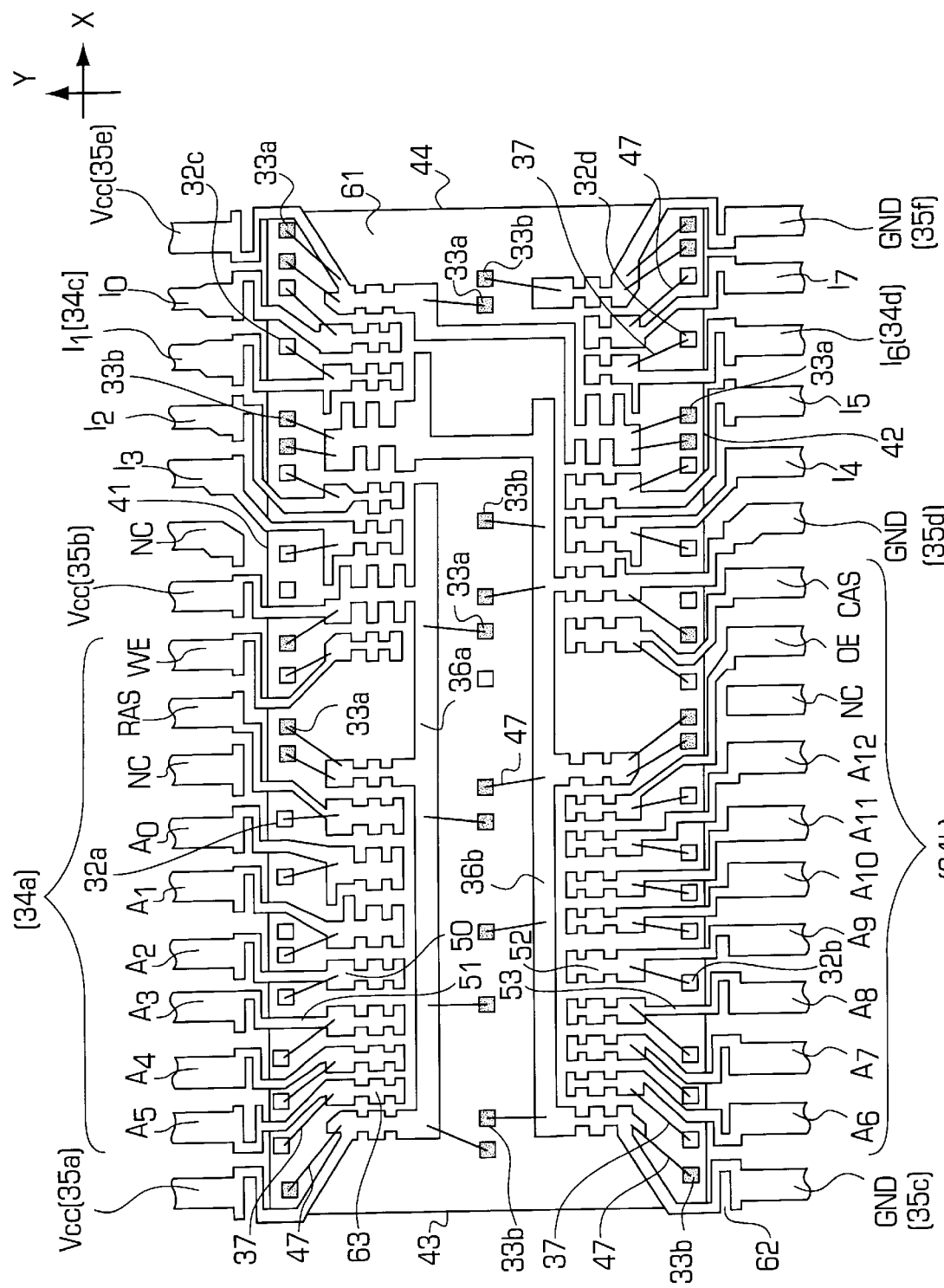
FIG. 6 is a plan view showing the relation between the semiconductor chip and the leads in a third embodiment of the invention.

An example of application of this intention to a semiconductor memory device is shown in FIG. 6 as the third embodiment of the invention. In FIG. 6 portions with identical or similar functions as in FIG. 3 are given the same reference symbols to avoid repeated explanation.

A plurality of the first and the second signal leads 34a and 34b traverse the first and the second edges 41 and 42 of the semiconductor chip 61, and extend on the chip. The first signal leads 34a include a signal lead $I_3$ for data input and output, a signal lead WE for write enable, a signal lead RAS for row address strobe input, and signal leads $A_0$ to $A_5$ for address input, and the second signal leads 34b include signal leads $A_6$ to $A_{12}$ for address input, a signal lead OE for output enable, a signal lead CAS for column address strobe input, and signal leads $I_4$ and $I_5$ for data input and output. In addition, on their outside (on the right side of the figure) there are laid extended signal leads $I_0$ to $I_2$ for data input and output as third signal leads, traversing the first edge 41, and signal leads $I_6$ and $I_7$ are laid extended as fourth signal leads 34d traversing the second edge 42.

On the other hand, the first power supply lead 35a for supplying Vcc traverses the first edge 41 and extends in the Y direction on the third edge 43 to enter the semiconductor chip 61, and the second power supply lead 35b enters the chip 61 by traversing the first edge 41, and they form a lead structure for vcc by being connected continuously to the first connecting conductor part 36a. Similarly, the third power supply lead 35c for supplying the ground potential (GND) enters the semiconductor chip 61 traversing the second edge 42 and extending in the Y direction on the third edge 43, and the fourth power supply lead 35d enters the chip 61 by traversing the second edge 42, and they form a lead structure for GND by being connected continuously to the second connecting conductor part 36b. In this embodiment, a fifth power supply lead 35e for supplying Vcc unconnected to the first connecting conductor part 36a enters the semiconductor chip 61 by extending in the Y direction on the fourth edge 44 from the first edge 41, and similarly, a sixth power supply lead 35f for supplying GND unconnected to the second connecting conductor part 36b enters the semiconductor chip 61 by extending in the Y direction on the fourth edge 44 from the second edge 42. Further, a part of the power supply lead structure system for Vcc protrude in the direction of the second edge 42 and is bonded to the power supply pads 33a for Vcc in the vicinity of the second edge by the first bonding wires 47, and a part of the lead structure system for the grounding potential protrude in the direction of the first edge 41 and is bonded to the power supply pads 33b for the grounding potential in the vicinity of the first edge by the first bonding wire 47.

As clearly shown in FIG. 6, the first pads 32a are arranged along the first side 41 of the chip, and each of the first signal leads 34a has a first part 50 formed on the chip between the first conductor part 36a of the first power supply lead 35a (which first part extends in the X direction parallel to the first side 41 of the chip) and the corresponding one of the first pads 32a. Each of the first signal leads 34a has a second part 51, extending from the first part 50, which passes around the corresponding first pad 32a and projectsfrom the first side 41 of the chip. Similarly, the second pads 32b are arranged along the second side 42 of the chip, and each of the second signal leads 34b has a first part 52 formed on the chip between the first conductor part 36b of the third power supply lead 35c and the corresponding one of the second pads 32b. Each second signal lead 34b also has a second part 53, extending from its first part 53, which passes around the corresponding second pad 32b and projects from the second side 42 of the chip. Moreover, the first parts 50, 52 of the signal leads 34a, 34b are made wider in the X-direction than at least a portion of their corresponding second parts 51, 53.

The tip parts of the first to the fourth signal leads 34a to 34d are given indented forms 63 in order to prevent disconnection of wires due to the difference in the coefficients of thermal expansion of the sealing resin and the lead frame, and parts away from the tip parts are bonded to the first to the fourth signal pads 32a to 32d represented by unpainted squares by the second bonding wires 37, In addition, the parts protruding in the Y direction of the first to the sixth power supply leads 35a to 35f and the first and the second connecting conductor parts 36a and 36b are also given indented forms for similar purposes, and the parts near the indented forms are bonded to the first and the second power supply pads 33a and 33b by the first bonding wires 47.

All of the first signal pads 32a connected to the first signal leads 34a, all of the third signal pads 32c connected to the third signal leads, and a part of the first power supply pads 32a and 32b are arranged in the vicinity of the first edge 41 along the X direction in parallel to the edge 41. Similarly, all of the second signal pads 32b connected to the second signal leads 34b, all of the fourth signal pads 32d connected to the fourth signal leads 34d, and a part of the first and the second power supply pads 33a and 33b are arranged in the vicinity of the second edge 42 along the X direction in parallel to the edge 42. The other part of the first and the second power supply pads 33a and 33b are arranged in the direction of the X direction at the central part, and its extension, of the semiconductor chip the area between the first connecting conductor part 36a and the second connecting conductor part 36b.

According to such a configuration, as shown in FIG. 6, it is possible to make the second bonding wires 37 that are connected to the first and the third signal leads 34a and 34c and are respectively connected to the first and the third signal pads 32a and 32c toward the direction of the first edge 41, and the second bonding wires 37 that are connected to the second and the fourth signal leads 34b and 34d and are respectively connected to the second and the fourth signal pads 32b and 32d, neither traverse any part of the other power supply lead structure and other signal leads nor traverse other bonding wires. Consequently, it is possible to absolutely eliminate short circuiting accident of the wires due to the traversing. It should be mentioned in FIG. 6 that NC means an unused lead and an unpainted square not connected to a wire indicates and unused pad. Furthermore, the reason for giving a zigzag form to each lead outside of the semiconductor chip 61 is to prevent the lead from falling off the sealing resin due to external pulling force after it is cut off from the lead frame following resin sealing.

Although the invention has been described with reference to specific embodiments, this description is not meant to be construced in a limiting sense. Various modifications of the disclosed embodiments, as well as other embodiments of the invention, will become apparent to persons skilled in the art upon reference to the description of the invention. It is therefore contemplated that the appended claims will cover any modifications of embodiments within the true scope of the invention.

What is claimed is:

1. A semiconductor integrated circuit device comprising:

a semiconductor chip having first (41) and second (42) sides which are in parallel to each other in a first direction (X), and third (43) and fourth (43) sides which are in parallel with each other in a second direction (Y) perpendicular to said first direction;

a first power supply lead (35a) having a first portion (36a) formed on said semiconductor chip and elongating in said first direction (X) and a second portion extending from an end part of said first portion (36a) and projecting from said first side (41) of said semiconductor chip;

a plurality of first pads (32a) formed on said semiconductor chip in line in said first direction (X) along said first side (41) of said semiconductor chip;

a plurality of first signal leads (34a) each having a first part (50) formed on said semiconductor chip between said first portion (36a) of said first power supply lead (35a) and a corresponding one of said first pads (32a), and a second part (51) extending from said first part, passing around said corresponding one of said first pads (32a) and projecting from said first side (41) of said semiconductor chip; and a plurality of first bonding wires each connecting said first part of one of said first signal leads to an associated one of said first pads.

2. The semiconductor integrated circuit device as claimed in claim 1, further comprising:

a second power supply lead (35c) having a third portion (36b) formed on said semiconductor chip and elongating in said first direction (X) and a fourth portion extending from an end part of said third portion (36b) and projecting from said second side (42) of said semiconductor chip;

a plurality of second pads (32b) formed on said semiconductor chip in line in said first direction along said second side (42) of said semiconductor chip;

a plurality of second signal leads (34b) each having a third part (52) formed on said semiconductor chip between said third portion (36b) of said second power supply lead (35c) and a corresponding one of said second pads (32b), and a fourth part (53) extending from said third part (52), passing around said corresponding one of said second pads (32b) and projecting from said second side (42) of said semiconductor chip; and a plurality of second bonding wires each connecting said third part of one of said second leads to an associated one of said second pads.

3. The semiconductor integrated circuit device as claimed in claim 1, wherein said first part (50) of each of said first signal leads (34a) is larger in width in said first direction (X) than a portion of said second part (51) formed on said chip, and said third part (52) of each of said second signal leads (34b) is larger in width in said first direction (X) than a portion of said fourth part (53) formed on said chip.

4. The semiconductor integrated circuit device as claimed in claim 3, further comprising a plurality of first power supply pads and a plurality of second power supply pads formed between said first portion of said first power supply lead and said third portion of said second power supply lead, each of said first power supply pads being connected to said first power supply lead via a third bonding wire and each of said second power supply pads being connected to said second power supply lead via a fourth bonding wire.

5. The semiconductor device as claimed in claim 1, wherein a width of said first part (50) of each of said first signal leads (34a) is larger in said first direction (X) than a width of a portion of said second part (51) formed on said chip.

* * * * *

UNITED STATES PATENT AND TRADEMARK OFFICE
CERTIFICATE OF CORRECTION

PATENT NO. : 5,977,614
DATED : November 2, 1999
INVENTOR(S) : Yasuhito Takeuchi

It is certified that error(s) appears in the above-identified patent and that said Letters Patent is hereby corrected as shown below:

Title page item:
[57] ABSTRACT, delete ABSTRACT in its entirety and insert the following replacement ABSTRACT:

--A lead-on-chip type of semiconductor integrated circuit device having a plurality of signal pads uniquely arranged relative to a conductor part of a power supply structure for eliminating the possibility of a short circuit between a signal lead and the conductor part due to the touching of a transversely distorted bonding wire with the conductor part. This novel wiring connection structure comprises first and second power supply structures, first signal lead and pad, and second signal lead and pad. The first power supply structure is constructed by interconnecting first and second power supply leads using a first connecting conductor part, and the second power supply structure is constructed by interconnecting third and fourth power supply leads using a second connecting conductor part. The first and second connecting conductor parts are placed at a central portion of a semiconductor chip with a predetermined spacing arranged between the parts. A plurality of first signal leads and pads are disposed between the first connecting connector part and a first edge, and a plurality of second signal leads and pads are disposed between the second connecting conductor part and a second edge.--

UNITED STATES PATENT AND TRADEMARK OFFICE
CERTIFICATE OF CORRECTION

PATENT : 5,977,614

DATED : November 2, 1999

Page 2 of 2

INVENTOR(S) : Yasuhito Takeuchi

It is certified that error appears in the above-identified patent and that said Letters Patent is hereby corrected as shown below:

is constructed by interconnecting third and fourth power supply leads using a second connecting conductor part. The first and second connecting conductor parts are placed at a central portion of a semiconductor chip with a predetermined spacing arranged between the parts. A plurality of first signal leads and pads are disposed between the first connecting connector part and a first edge, and a plurality of second signal leads and pads are disposed between the second connecting conductor part and a second edge.--

Signed and Sealed this

Seventeenth Day of October, 2000

Attest:

Q. TODD DICKINSON

*Attesting Officer*     *Director of Patents and Trademarks*